(12) United States Patent
Priewasser et al.

(10) Patent No.: US 9,935,010 B2
(45) Date of Patent: Apr. 3, 2018

(54) METHOD OF PROCESSING A WAFER AND WAFER PROCESSING SYSTEM

(71) Applicant: DISCO CORPORATION, Tokyo (JP)

(72) Inventors: Karl Priewasser, Munich (DE); Hitoshi Hoshino, Munich (DE)

(73) Assignee: DISCO Corporation, Tokyo (JP)

(*) Notice: Subject to any disclaimer, the term of this patent is extended or adjusted under 35 U.S.C. 154(b) by 0 days.

(21) Appl. No.: 15/628,254

(22) Filed: Jun. 20, 2017

(65) Prior Publication Data
US 2017/0365519 A1    Dec. 21, 2017

(30) Foreign Application Priority Data

Jun. 21, 2016 (DE) .................. 10 2016 211 044

(51) Int. Cl.
| | |
|---|---|
| *H01L 21/8222* | (2006.01) |
| *H01L 27/01* | (2006.01) |
| *H01L 21/76* | (2006.01) |
| *B23K 26/08* | (2014.01) |
| *B28D 5/00* | (2006.01) |
| *B23K 26/364* | (2014.01) |

(52) U.S. Cl.
CPC ........ *H01L 21/8222* (2013.01); *B23K 26/083* (2013.01); *B23K 26/364* (2015.10); *B28D 5/0029* (2013.01); *H01L 21/76* (2013.01); *H01L 27/01* (2013.01)

(58) Field of Classification Search
CPC .................................................. H01L 21/8222
See application file for complete search history.

(56) References Cited

U.S. PATENT DOCUMENTS

| | | | | |
|---|---|---|---|---|
| 2007/0057378 A1* | 3/2007 | Arai | ................... | B23K 26/0054 257/777 |
| 2011/0050047 A1* | 3/2011 | Numata | ............... | H03H 9/1021 310/344 |
| 2011/0138857 A1* | 6/2011 | Numata | ................ | C03B 33/037 65/28 |
| 2012/0100694 A1 | 4/2012 | Kajiyama et al. | | |
| 2014/0339673 A1 | 11/2014 | Shoichi et al. | | |
| 2015/0348821 A1 | 12/2015 | Iwanaga et al. | | |
| 2015/0364375 A1* | 12/2015 | Nakamura | ............ | H01L 21/268 438/462 |

FOREIGN PATENT DOCUMENTS

DE    10 2010 046 665 A1    4/2011

OTHER PUBLICATIONS

Examination report issued in German Patent App. No. 10 2016211 044 dated Mar. 2, 2017.

* cited by examiner

*Primary Examiner* — Errol Fernandes
(74) *Attorney, Agent, or Firm* — Greer Burns & Crain Ltd.

(57) ABSTRACT

A wafer has a device area on one side with a plurality of devices partitioned by a plurality of division lines. Either side of the wafer is attached to an adhesive tape supported by a first annular frame. A modified region is formed in the wafer along the division lines by a laser. The wafer is placed on a support member whose outer diameter is smaller than an inner diameter of the first annular frame. After applying the laser beam, the adhesive tape is expanded thereby dividing the wafer along the division lines. A second annular frame is attached to a portion of the expanded adhesive tape. An inner diameter of the second annular frame is smaller than the outer diameter of the support member and smaller than the inner diameter of the first annular frame.

12 Claims, 4 Drawing Sheets

METHOD OF PROCESSING A WAFER AND WAFER PROCESSING SYSTEM

TECHNICAL FIELD

The present invention relates to a method of processing a wafer, having on one side a device area with a plurality of devices partitioned by a plurality of division lines. Further, the invention relates to a wafer processing system for carrying out this method.

TECHNICAL BACKGROUND

In a semiconductor device fabrication process, a wafer having a device area with a plurality of devices partitioned by a plurality of division lines is divided into individual dies or chips along the division lines.

Substantially the same approach as detailed above is also adopted to obtain, for example, individual power devices, optical devices, medical devices, electrical components or MEMS devices from wafers with device areas, in which these devices are formed.

In order to reduce the strength of the wafer along the division lines prior to dividing the wafer, it is known to form a modified region in the wafer along the division lines. This modified region may be in the form of a modified layer formed inside the wafer or in the form of a plurality of hole regions, wherein each hole region is composed of an amorphous region and a space in the amorphous region open to at least one surface of the wafer. Such a modified region is formed by applying a laser beam with a suitable wavelength to the wafer along the division lines.

After the modified region has been formed in the wafer along the division lines, an external force is applied to the wafer in the radial directions thereof, thereby dividing the wafer along the division lines and separating the resulting dies or chips from each other. In particular, the wafer may be attached to an expandable tape and the external force may be applied thereto by radially expanding the tape.

Subsequently, the separated dies or chips may be picked up from the tape. Alternatively, the dies or chips are kept on the tape and, in this state, subjected to further processing, stored or shipped. When keeping the separated dies or chips attached to the tape, it is important to maintain radial tension of the tape, in order to prevent damage to the dies or chips due to any unintentional contact therebetween.

DE 10 2010 046 665 A1 discloses a method of processing a wafer in which, after separating dies from each other by radially expanding an expandable tape, a ring-shaped tape is attached to a peripheral portion of the expanded tape, so as to keep the expanded tape under radial tension. The ring-shaped tape is supported by an annular frame.

However, the approach taught in DE 10 2010 046 665 A1 requires the preparation of an annular frame with a suitably adapted ring-shaped tape attached thereto and is thus laborious and time-consuming. Since the tape has to be cut into an appropriate ring shape, there are significant material losses, resulting in increased processing costs. Also, the characteristics of the ring-shaped tape have to be precisely matched with those of the expandable tape, thus restricting the choice of possible tape materials. Further, the tension of the ring-shaped tape may decrease over time, creating the risk of unintentional contact between the dies, e.g., during storage or shipping thereof.

Hence, there remains a need for a method of processing a wafer and a wafer processing system which allow for the wafer to be processed in an efficient, reliable and cost-efficient manner.

SUMMARY OF THE INVENTION

Accordingly, it is an object of the present invention to provide a method of processing a wafer and a wafer processing system which allow for the wafer to be processed in an efficient, reliable and cost-efficient manner. This goal is achieved by a wafer processing method with the technical features of claim 1 and a wafer processing system with the technical features of claim 11. Preferred embodiments of the invention follow from the dependent claims.

The invention provides a method of processing a wafer, having on one side a device area with a plurality of devices partitioned by a plurality of division lines. The method comprises attaching the one side of the wafer or the side of the wafer opposite to the one side to an adhesive tape supported by a first annular frame, so that the wafer is arranged within a central opening of the first annular frame, applying a laser beam to the wafer along the division lines, so as to form a modified region in the wafer along the division lines, and placing the wafer attached to the adhesive tape on a support surface of a support member before or after applying the laser beam to the wafer, so that the side of the adhesive tape opposite to the side thereof which is attached to the wafer is in contact with the support surface. An outer diameter of the support member in the plane of the support surface is smaller than an inner diameter of the first annular frame. The adhesive tape is an expandable adhesive tape. The method further comprises, after applying the laser beam to the wafer, moving the first annular frame and at least a peripheral part of the support member relative to each other in the direction perpendicular to the plane of the support surface, so as to radially expand the adhesive tape in the directions lying in the plane of the support surface, thereby dividing the wafer along the division lines into a plurality of dies, and attaching a second annular frame to a portion of the expanded adhesive tape arranged at the peripheral part of the support member. The second annular frame is attached to the side of the adhesive tape which is attached to the wafer and the wafer, which has been separated into the plurality of dies, is arranged within a central opening of the second annular frame. An inner diameter of the second annular frame is smaller than the outer diameter of the support member in the plane of the support surface and smaller than the inner diameter of the first annular frame.

Herein, the expression "outer diameter of the support member in the plane of the support surface" defines the outer diameter of the support member in the radial directions of the support member.

According to the processing method of the invention, the second annular frame is attached to the portion of the expanded adhesive tape arranged at the peripheral part of the support member, with the wafer, which has been separated into the plurality of dies, being arranged within the central opening of the second annular frame. The inner diameter of the second annular frame is smaller than the outer diameter of the support member in the plane of the support surface and smaller than the inner diameter of the first annular frame.

Hence, the second annular frame can be attached to the peripheral portion of the expanded adhesive tape in a simple manner, reliably maintaining radial tension of the tape and thus preventing any damage to the dies due to an unintentional contact therebetween.

Since no additional tape has to be prepared for keeping the expanded adhesive tape under tension, the efficiency of the processing method is significantly improved. Further, no material losses occur, so that the processing costs are minimised. Moreover, due to the use of the second annular frame which is attached directly to the peripheral portion of the expanded adhesive tape, the tension applied to the expanded tape can be reliably maintained over an extended period of time.

Therefore, the processing method of the invention allows for the wafer to be processed in an efficient, reliable and cost-efficient manner.

The laser beam may be applied to the one side of the wafer or to the side of the wafer opposite to the one side.

The one side of the wafer, i.e., the front side of the wafer on which the device area is formed, may be attached to the adhesive tape supported by the first annular frame. In this case, the laser beam can be applied to the side of the wafer opposite to the one side, i.e., the back side of the wafer, along the division lines in a particularly simple manner.

Alternatively, the back side of the wafer may be attached to the adhesive tape supported by the first annular frame. In this case, the laser beam can be applied to the front side of the wafer along the division lines in a particularly simple manner.

The choice of which side of the wafer is attached to the adhesive tape may be made dependent on the material and/or condition of the wafer and/or the type of modified region to be formed therein.

The laser beam may be applied to the side of the wafer which is attached to the adhesive tape. In this case, the laser beam is applied to the wafer through the adhesive tape.

The laser beam may be applied to the side of the wafer which is opposite to the side of the wafer attached to the adhesive tape. Thus, the laser beam may be applied to the exposed side of the wafer.

The modified region to be formed in the wafer along the division lines may be in the form of a modified layer or in the form of a plurality of hole regions, wherein each hole region is composed of an amorphous region and a space in the amorphous region open to at least one surface of the wafer, i.e., the wafer front side and/or back side surface.

In order to form such a modified layer in the wafer along the division lines, a laser beam with a wavelength which allows transmission thereof through the wafer may be used. A focal point of the laser beam may be positioned inside the wafer at a depth of the wafer in the wafer thickness direction at which the modified layer is to be formed. The focal point arranged at this depth position may be scanned along the division lines so as to form the modified layer. The modified layer may be, for example, an at least partially cracked layer or a layer of molten and resolidified wafer material.

Since, in this way, the modified layer can be formed in the wafer by positioning the focal point of the laser beam inside the wafer, the laser beam can be applied from the front side or the back side of the wafer.

Alternatively, a plurality of hole regions may be formed in the wafer along the division lines in order to provide the modified region. For example, these hole regions may be formed by applying a laser beam to the wafer from the back side thereof, in a plurality of positions along the division lines, in a condition where a focal point of the laser beam is located at a distance from the back side in the thickness direction of the wafer, so as to form the hole regions in the wafer, each hole region extending from the wafer back side towards the wafer front side. Each hole region may be composed of an amorphous region and a space in the amorphous region open to the back side of the wafer.

The laser beam applied to the wafer along the division lines for forming the modified region may be a pulsed laser beam.

The processing method of the invention may further comprise a grinding step for adjusting the wafer thickness. The grinding step may be performed from the back side of the wafer which is opposite to the wafer front side on which the device area is formed. The grinding step may be carried out before or after applying the laser beam to the wafer along the division lines, so as to form the modified region in the wafer along the division lines.

The wafer may be, for example, a semiconductor wafer, a glass wafer, a sapphire wafer, a ceramic wafer, such as an alumina ($Al_2O_3$) ceramic wafer, a silicon oxide ($SiO_2$) wafer, an aluminium nitride (AlN) wafer or the like.

In particular, the wafer may be, for example, a silicon (Si) wafer, a gallium arsenide (GaAs) wafer, a gallium nitride (GaN) wafer, a gallium phosphide (GaP) wafer, an indium arsenide (InAs) wafer, an indium phosphide (InP) wafer, a silicon carbide (SiC) wafer, a silicon nitride (SiN) wafer, a lithium tantalate (LT) wafer, a lithium niobate (LN) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The wafer may be a semiconductor-sized wafer. Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 3 inch, 4 inch, 5 inch, 6 inch, 8 inch, 12 inch or 18 inch wafer.

The devices formed in the device area on the front side of the wafer may be, for example, semiconductor devices, power devices, optical devices, medical devices, electrical components, MEMS devices or combinations thereof.

When radially expanding the adhesive tape in the directions lying in the plane of the support surface, thereby dividing the wafer along the division lines into a plurality of dies, the side of the wafer which is not attached to the adhesive tape may be arranged so as to face upwards or downwards, i.e., upwards or downwards in the direction of gravity. If the side of the wafer which is not attached to the adhesive tape is oriented downwards, it can be particularly reliably ensured that any particles, such as debris, generated during wafer separation are prevented from adhering to surfaces of the dies.

Before radially expanding the adhesive tape in the directions lying in the plane of the support surface, an additional step of breaking the wafer along the division lines may be carried out. In this way, a particularly well-defined separation of the dies from each other can be ensured.

The first and second annular frames are rigid frames. The first and/or the second annular frame may be made of a metal or a plastic material, such as a polymer.

The first and/or the second annular frame may have a thickness of at least 2 mm, preferably at least 3 mm and more preferably at least 4 mm. The first and/or the second annular frame may have a thickness in the range of 2 mm to 12 mm, preferably in the range of 3 mm to 10 mm and more preferably in the range of 4 mm to 8 mm.

The adhesive tape may comprise a base layer and an adhesive layer applied to the base layer. The base layer may be made of a polymer material, such as polyvinyl chloride (PVC), ethylene vinyl acetate (EVA) or polyolefin.

In one embodiment, the wafer attached to the adhesive tape is placed on the support surface of the support member before applying the laser beam to the wafer, and the laser beam is applied to the wafer placed on the support surface along the division lines, so as to form the modified region in the wafer along the division lines. In this case, the same support member can be used for holding the wafer during the application of the laser beam and for radially expanding the adhesive tape, thus further increasing the processing efficiency.

In another embodiment, the wafer attached to the adhesive tape is placed on the support surface of the support member after applying the laser beam to the wafer. This approach offers a particularly high degree of flexibility. For example, in this case, a single support member may be used for, i.e., in combination with, a plurality of, e.g., two or three, laser beam applying means, thus significantly reducing the equipment costs.

A further process, such as a cleaning process, or further processes may be performed on the wafer placed on the support surface, e.g., before and/or after radially expanding the adhesive tape. In this case, the same support member can be used for holding the wafer during the further process or processes and for radially expanding the adhesive tape, thus further increasing the processing efficiency.

The support member may be in the form of a support table, e.g., having a circular cross-section in the plane of the support surface. For example, the support member may be a chuck table. The support member may have a continuous support surface.

When the wafer attached to the adhesive tape is placed on the support surface of the support member, at least a portion of the wafer attached to the adhesive tape may rest, i.e., rest directly, on the support surface. The entire wafer attached to the adhesive tape may rest, i.e., rest directly, on the support surface.

The support member may have a substantially annular cross-section or an annular cross-section in the plane of the support surface. For example, the support member may be a hollow expansion drum. The support member may have a discontinuous support surface.

When the wafer attached to the adhesive tape is placed on the support surface of the support member, the wafer may be held on the support surface through the adhesive tape. No portion of the wafer attached to the adhesive tape may rest directly on the support surface.

The first annular frame and the entire support member, e.g., a support table or a support member with substantially annular or annular cross-section, may be moved relative to each other in the direction perpendicular to the plane of the support surface, so as to radially expand the adhesive tape in the directions lying in the plane of the support surface, thereby dividing the wafer along the division lines into the plurality of dies.

The relative movement between first annular frame and support member may be effected by moving only the first annular frame and keeping the support member stationary, by moving only the support member and keeping the first annular frame stationary, or by moving the first annular frame and the support member relative to each other in opposite directions. The support member may comprise a central part and a substantially annular or annular peripheral part surrounding the central part.

The central part may be in the form of a support table, e.g., having a circular cross-section in the plane of the support surface. For example, the central part may be in the form of a chuck table. The central part may have a continuous support surface.

The peripheral part has a substantially annular cross-section or an annular cross-section in the plane of the support surface. For example, the peripheral part may be in the form of a hollow expansion drum. The peripheral part has a discontinuous support surface.

The peripheral part of the support member may be movable relative to the central part of the support member in the direction perpendicular to the plane of the support surface. The first annular frame and the peripheral part of the support member may be moved relative to each other in the direction perpendicular to the plane of the support surface, so as to radially expand the adhesive tape in the directions lying in the plane of the support surface, thereby dividing the wafer along the division lines into the plurality of dies. Only the peripheral part of the support member and the first annular frame may be moved relative to each other. The central part of the support member may be kept stationary.

The processing method of the invention may further comprise, after attaching the second annular frame to the expanded adhesive tape, circumferentially cutting the adhesive tape in a position arranged outside, i.e., radially outside, the portion of the adhesive tape which is attached to the second annular frame. In this way, the portion of the adhesive tape attached to the second annular frame can be separated from the remainder of the tape in a simple and efficient manner, allowing for the second annular frame and the divided wafer attached thereto through the adhesive tape to be removed from the wafer processing system. Subsequently, the divided wafer supported by the second annular frame may be, for example, subjected to further processing, stored or shipped.

The support member, e.g., in the form of a support table, such as a chuck table, may have a chamfered or tapered peripheral portion, so that the diameter of the support member decreases with increasing distance from the support surface in the direction perpendicular to the plane of the support surface. Such a chamfered or tapered peripheral portion allows for a particularly good access to the adhesive tape for a cutting tool used in cutting the adhesive tape. Hence, in this case, the cutting process can be carried out in a particularly efficient and accurate manner.

The processing method of the invention may further comprise, after cutting the adhesive tape, attaching to the second annular frame a portion of the adhesive tape which is arranged between the position where the adhesive tape had been cut and the portion of the adhesive tape which is attached to the second annular frame. In this way, it can be reliably prevented that a portion of the adhesive tape may be separated, e.g., peeled off, from the second annular frame. Thus, a particularly stable and reliable fixation of the adhesive tape to the second annular frame can be ensured.

The portion of the adhesive tape which is arranged between the position where the adhesive tape had been cut and the portion of the adhesive tape which is attached to the second annular frame may be attached to the second annular frame, e.g., by using a roller or a plurality, such as a pair, of rollers. For example, the roller or the plurality of rollers may be moved circumferentially along the portion of the adhesive tape which is to be attached to the second annular frame, pressing the portion of the adhesive tape against the second annular frame, thereby attaching these two components to each other.

The processing method of the invention may further comprise, e.g., before cutting the adhesive tape, applying pressure to the portion of the expanded adhesive tape attached to the second annular frame, for example, by using a roller or a plurality, such as a pair, of rollers. For example, the roller or the plurality of rollers may be moved circumferentially along the portion of the adhesive tape which is attached to the second annular frame, pressing the portion of the adhesive tape against the second annular frame. In this way, a particularly stable and reliable fixation of the adhesive tape to the second annular frame can be ensured.

The inner diameter of the second annular frame may be smaller than the outer diameter of the support member in the plane of the support surface and/or smaller than the inner diameter of the first annular frame by 20 mm or more, preferably by 30 mm or more. Thereby, it can be ensured in a simple and efficient manner that the portion of the adhesive tape which is attached to the second annular frame is an annular tape portion with a ring width of at least 10 mm, preferably at least 15 mm. Herein, the term "ring width" defines half the difference between an outer diameter of an annular element and an inner diameter thereof, i.e., outer diameter minus inner diameter divided by two.

In this way, a particularly reliable and stable connection between the adhesive tape and the second annular frame is achieved.

The first annular frame and the second annular frame may have the same ring width. The first annular frame may have a ring width which is smaller than the ring width of the second annular frame. The first annular frame may have a ring width which is larger than the ring width of the second annular frame.

The first and/or the second annular frame may have a ring width in the range of 20 mm to 70 mm, preferably in the range of 30 mm to 60 mm and more preferably in the range of 40 mm to 50 mm.

The first and second frames are annular frames. Herein, the term "annular" encompasses shapes which deviate from a perfect annulus, e.g., due to the presence of one or more flat or straight portions, notches and/or grooves, e.g., at the outer and/or inner circumference of the annulus. The first and/or the second annular frame may have a minimum ring width, e.g., at a position of the annulus where a flat or straight portion, a notch or a groove is present, in the range of 20 mm to 70 mm, preferably in the range of 30 mm to 60 mm and more preferably in the range of 40 mm to 50 mm.

The outer diameter of the first annular frame may be substantially the same as the outer diameter of the second annular frame. In this way, a particularly efficient and space saving arrangement can be provided, since first and second frame holding means for holding the first and second annular frames, respectively, can be chosen so as to have substantially the same size.

The outer diameter of the first annular frame may be larger than the outer diameter of the second annular frame. The outer diameter of the first annular frame may be smaller than the outer diameter of the second annular frame.

The second annular frame may be a semiconductor-sized annular frame. Herein, the term "semiconductor-sized annular frame" refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are also defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 3 inch, 4 inch, 5 inch, 6 inch, 8 inch, 12 inch or 18 inch.

By providing a semiconductor-sized annular frame as the second annular frame, further processing of the wafer after it has been divided, e.g., further processing after storage or shipping thereof, is facilitated. In particular, by choosing a semiconductor-sized annular frame, compatibility of the unit formed by wafer, adhesive tape and second annular frame with common semiconductor wafer processing equipment, e.g., at a facility different from that where the division of the wafer had been carried out, is ensured.

The invention further provides a wafer processing system for processing a wafer, having on one side a device area with a plurality of devices partitioned by a plurality of division lines. The system comprises a support member having a support surface for placing the wafer thereon, a first frame holding means for holding a first annular frame, a laser beam applying means for applying a laser beam to the wafer along the division lines, and a second frame holding means for holding a semiconductor-sized second annular frame. The support member and the first frame holding means are configured so that the first frame holding means and at least a peripheral part of the support member are movable relative to each other in the direction perpendicular to the plane of the support surface. The support member and the second frame holding means are configured so that the second frame holding means and at least the peripheral part of the support member are movable relative to each other in the direction perpendicular to the plane of the support surface. An outer diameter of the support member in the plane of the support surface is larger than an inner diameter of the semiconductor-sized second annular frame.

The wafer processing system of the invention is a system configured for carrying out the wafer processing method of the invention. The wafer processing system thus provides the technical effects and advantages already described in detail above for the wafer processing method.

The features described above for the wafer processing method of the invention also apply to the wafer processing system of the invention. In particular, the support member of the wafer processing system has been described in detail above.

By moving the first frame holding means and at least a peripheral part of the support member relative to each other in the direction perpendicular to the plane of the support surface, an adhesive tape supported by the first annular frame is radially expanded in the directions lying in the plane of the support surface by the support member, thereby dividing the wafer attached to the adhesive tape along the division lines into a plurality of dies.

By moving the second frame holding means and at least the peripheral part of the support member relative to each other in the direction perpendicular to the plane of the support surface, the semiconductor-sized second annular frame is attached to a portion of the expanded adhesive tape arranged at the peripheral part of the support member.

The laser beam applying means may be configured for applying a laser beam to the wafer placed on the support surface of the support member.

The wafer processing system may further comprise a first moving means for moving the first frame holding means and at least a peripheral part of the support member relative to each other in the direction perpendicular to the plane of the support surface.

The wafer processing system may further comprise a second moving means for moving the second frame holding means and at least the peripheral part of the support member relative to each other in the direction perpendicular to the plane of the support surface.

The wafer processing system may further comprise a cutting means for cutting the adhesive tape supported by the first annular frame. The cutting means may be configured for circumferentially cutting the adhesive tape in a position arranged outside, i.e., radially outside, the portion of the adhesive tape which is attached to the second annular frame.

The wafer processing system may further comprise a pressing means for applying pressure to a portion of the adhesive tape. For example, the pressing means may comprise a roller or a plurality, such as a pair, of rollers.

The pressing means may be configured for, after cutting the adhesive tape, attaching to the second annular frame a portion of the adhesive tape which is arranged between the position where the adhesive tape had been cut and the portion of the adhesive tape which is attached to the second annular frame. For example, the roller or the plurality of rollers of the pressing means may be moved circumferentially along the portion of the adhesive tape which is to be attached to the second annular frame, pressing the portion of the adhesive tape against the second annular frame, thereby attaching these two components to each other.

The pressing means may be configured for, e.g., before cutting the adhesive tape, applying pressure to the portion of the expanded adhesive tape attached to the second annular frame. For example, the roller or the plurality of rollers of the pressing means may be moved circumferentially along the portion of the adhesive tape which is attached to the second annular frame, pressing the portion of the adhesive tape against the second annular frame.

The wafer processing system may further comprise a cleaning means for cleaning the wafer, e.g., after the wafer has been divided.

The wafer processing system may further comprise a breaking means for breaking the wafer along the division lines before radially expanding the adhesive tape in the directions lying in the plane of the support surface.

The wafer processing system may comprise a single wafer processing apparatus or a plurality of, e.g., two or three, wafer processing apparatuses. The plurality of wafer processing apparatuses may be connected to each other.

For example, the wafer processing system may comprise two wafer processing apparatuses, i.e., a first wafer processing apparatus and a second wafer processing apparatus. The first wafer processing apparatus and the second wafer processing apparatus may be connected to each other, e.g., in line. The first wafer processing apparatus may comprise the laser beam applying means. The second wafer processing apparatus may comprise the support member and the first and second frame holding means. Further, the second wafer processing apparatus may comprise the first moving means and the second moving means. The second wafer processing apparatus may comprise the cleaning means.

The wafer processing system may comprise three or more wafer processing apparatuses connected to each other. One of the wafer processing apparatuses may comprise the support member and the first and second frame holding means. The other wafer processing apparatuses may each comprise a laser beam applying means. In this case, a single support member and single first and second frame holding means may be used for, i.e., in combination with, a plurality of, e.g., two or three, laser beam applying means, thus significantly reducing the equipment costs.

Alternatively, the wafer processing system may comprise a single wafer processing apparatus which comprises the laser beam applying means, the support member and the first and second frame holding means. Further, the single wafer processing apparatus may comprise the first moving means and the second moving means. The single wafer processing apparatus may comprise the cleaning means.

The wafer processing system may comprise a control for controlling the components of the system.

The control may be configured to control movement of the first frame holding means and at least a peripheral part of the support member relative to each other in the direction perpendicular to the plane of the support surface, e.g., by controlling the first moving means.

The control may be configured to control movement of the second frame holding means and at least the peripheral part of the support member relative to each other in the direction perpendicular to the plane of the support surface, e.g., by controlling the second moving means.

The control may be configured to control the application of the laser beam to the wafer along the division lines by controlling the laser beam applying means.

The control may be configured to control the wafer processing system so as to carry out the wafer processing method of the invention.

The control may be configured to control the cutting means and/or the pressing means and/or the cleaning means and/or the breaking means.

The wafer processing system may further comprise the first annular frame, wherein the outer diameter of the support member in the plane of the support surface is smaller than an inner diameter of the first annular frame.

The inner diameter of the semiconductor-sized second annular frame is smaller than the inner diameter of the first annular frame.

The wafer processing system may further comprise the semiconductor-sized second annular frame.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a wafer and to wafer processing systems for carrying out these methods.

In the following, a first embodiment of the method of processing a wafer of the present invention and of the wafer processing system of the present invention will be described with reference to FIGS. 1 to 6.

Figure 1:
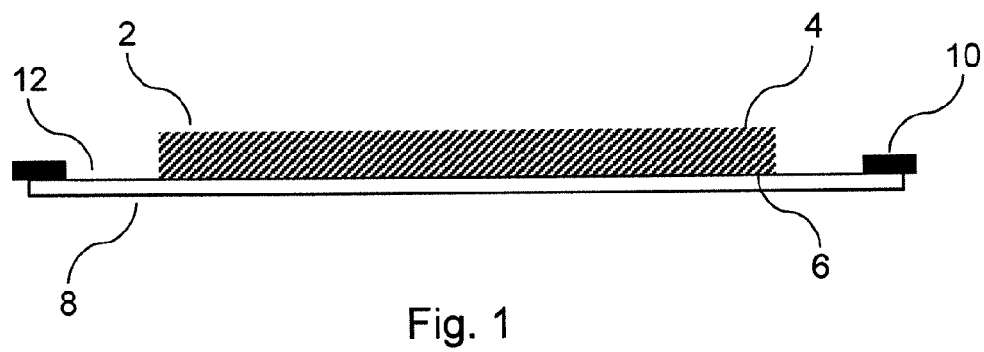
FIG. 1 is a cross-sectional view showing a wafer attached to an adhesive tape supported by a first annular frame.

As is shown in FIG. 1, the wafer 2 to be processed by the method of the invention has a front side 4 and a back side 6 opposite to the front side 4. A device area (not shown) with a plurality of devices partitioned by a plurality of division lines (not shown) is formed on the front side 4 of the wafer 2.

The wafer 2 may be, for example, a semiconductor wafer, a glass wafer, a sapphire wafer, a ceramic wafer, such as an alumina ($Al_2O_3$) ceramic wafer, a silicon oxide ($SiO_2$) wafer, an aluminium nitride (AlN) wafer or the like.

In particular, the wafer 2 may be, for example, a silicon (Si) wafer, a gallium arsenide (GaAs) wafer, a gallium nitride (GaN) wafer, a gallium phosphide (GaP) wafer, an indium arsenide (InAs) wafer, an indium phosphide (InP) wafer, a silicon carbide (SiC) wafer, a silicon nitride (SiN) wafer, a lithium tantalate (LT) wafer, a lithium niobate (LN) wafer or the like.

The devices formed in the device area on the front side 4 of the wafer 2 may be, for example, semiconductor devices, power devices, optical devices, medical devices, electrical components, MEMS devices or combinations thereof.

In the method of the first embodiment, the back side 6 of the wafer 2 is first attached to an adhesive tape 8 supported by a first annular frame 10, so that the wafer 2 is arranged within a central opening 12 of the first annular frame 10. The result of this attachment step is illustrated in FIG. 1.

Subsequently, the wafer 2 attached to the adhesive tape 8 is placed on a support surface 14 of a support member 16, so that the side of the adhesive tape 8 opposite to the side thereof which is attached to the wafer 2 is in contact with the support surface 14 (see FIG. 2). As is illustrated in FIG. 2, the entire wafer 2 attached to the adhesive tape 8 rests directly on the support surface 14 of the support member 16.

Figure 2:
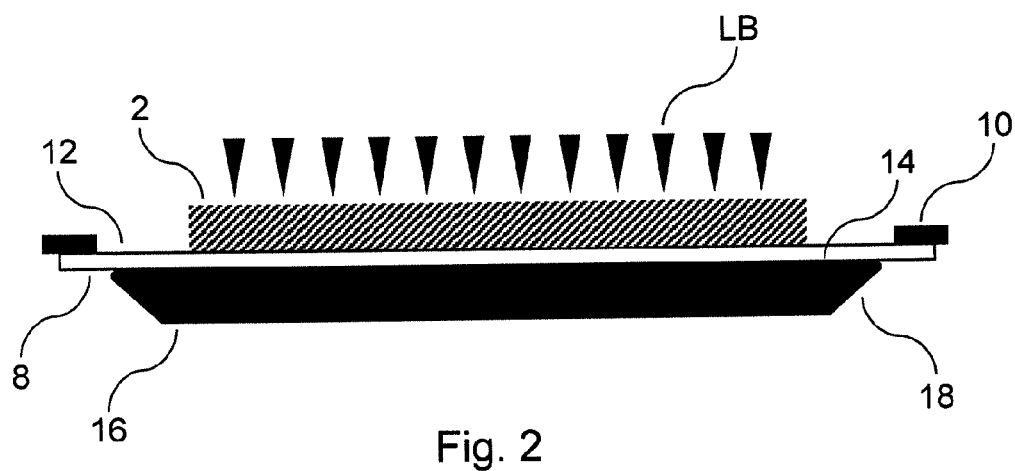
FIG. 2 is a cross-sectional view illustrating a step of applying a laser beam to the wafer attached to the adhesive tape according to a first embodiment of the method of the present invention.

The support member 16 shown in FIG. 2 is in the form of a support table having a circular cross-section in the plane of the support surface 14. For example, the support member 16 may be a chuck table. The support member 16 has a continuous support surface 14.

Further, the support member 16 has a chamfered or tapered peripheral portion 18, so that the diameter of the support member 16 decreases with increasing distance from the support surface 14 in the direction perpendicular to the plane of the support surface 14. This chamfered or tapered peripheral portion 18 allows for a particularly good access to the adhesive tape 8 for a cutting tool used in cutting the adhesive tape, as will be explained in further detail with reference to FIG. 5 below.

As is shown in FIG. 2, an outer diameter of the support member 16 in the plane of the support surface 14 is smaller than an inner diameter of the first annular frame 10.

After the wafer 2 attached to the adhesive tape 8 has been placed on the support surface 14 of the support member 16, a laser beam LB is applied to the wafer 2 along the division lines, so as to form a modified region (not shown) in the wafer 2 along the division lines, as is illustrated in FIG. 2. The laser beam LB is applied to the wafer 2 by a laser beam applying means (not shown).

The support member 16 and the laser beam applying means form part of a wafer processing system (not shown) according to a first embodiment of the present invention.

As has been detailed above, the modified region formed in the wafer 2 may be, for example, in the form of a modified layer or in the form of a plurality of hole regions, wherein each hole region is composed of an amorphous region and a space in the amorphous region open to at least one surface of the wafer 2. For example, the space in the amorphous region may be open only to the wafer front side 4 or open to the wafer front side 4 and to the wafer back side 6.

Figure 3:
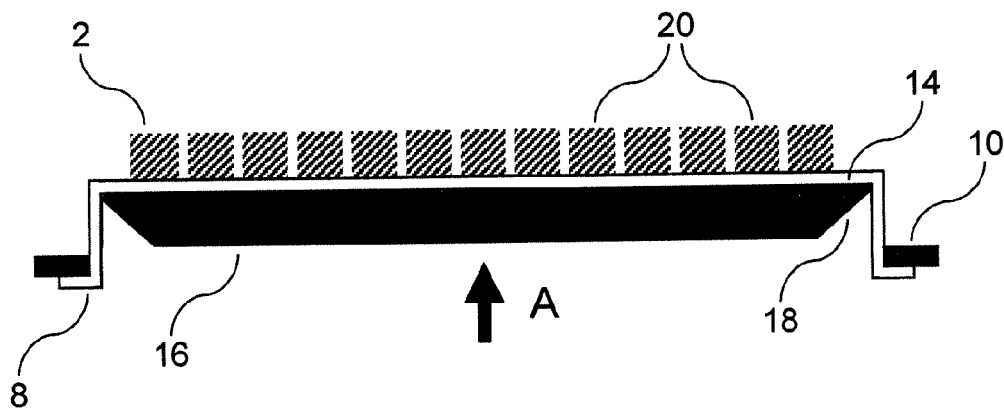
FIG. 3 is a cross-sectional view illustrating a step of radially expanding the adhesive tape according to the first embodiment of the method of the present invention.

After the laser beam LB has been applied to the wafer 2, forming the modified region in the wafer 2, the first annular frame 10 and the entire support member 16 are moved relative to each other in the direction perpendicular to the plane of the support surface 14, as is illustrated by an arrow A in FIG. 3. The relative movement between first annular frame 10 and support member 16 may be effected by moving only the first annular frame 10 and keeping the support member 16 stationary, by moving only the support member 16 and keeping the first annular frame 10 stationary, or by moving the first annular frame 10 and the support member 16 relative to each other in opposite directions.

Since the outer diameter of the support member 16 in the plane of the support surface 14 is smaller than the inner diameter of the first annular frame 10, the support member 16 can move through the central opening 12 of the first annular frame 10 in the direction of the arrow A in FIG. 3. Due to this relative movement between first annular frame 10 and support member 16, the adhesive tape 8 is radially expanded in the directions lying in the plane of the support surface 14, thereby dividing the wafer 2 along the division lines into a plurality of dies 20 (see FIG. 3).

The first annular frame 10 and the support member 16 are moved relative to each other by using a first frame holding means (not shown) and a first moving means (not shown).

The first frame holding means holds the first annular frame 10. The first moving means moves the first frame holding means, holding the first annular frame 10, and the support member 16 relative to each other in the direction perpendicular to the plane of the support surface 14.

The first frame holding means and the first moving means form part of the wafer processing system according to the first embodiment of the present invention. The wafer processing system further comprises a control (not shown) configured to control movement of the first frame holding means and the support member 16 relative to each other in the direction perpendicular to the plane of the support surface 14, by controlling the first moving means.

Figure 4:
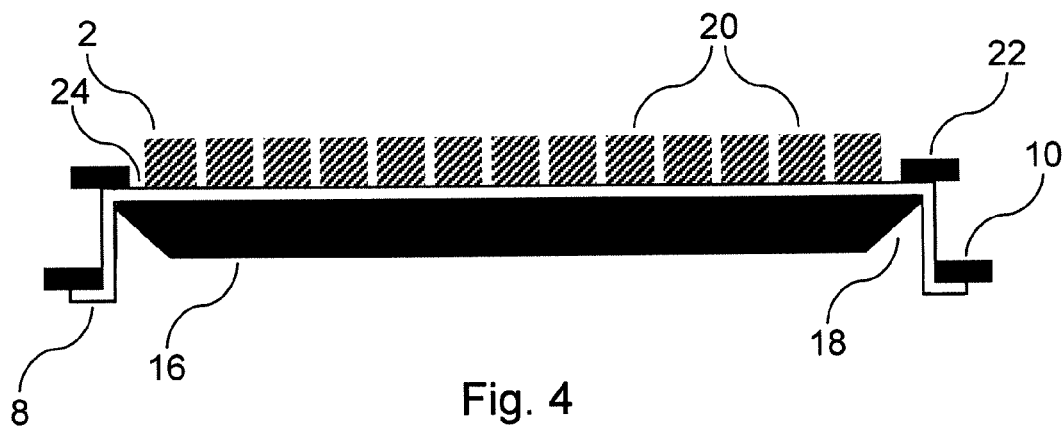
FIG. 4 is a cross-sectional view illustrating a step of attaching a second annular frame to a portion of the expanded adhesive tape according to the first embodiment of the method of the present invention.

Subsequently, a second annular frame 22 is attached to a portion of the expanded adhesive tape 8 arranged at the peripheral part of the support member 16, as is illustrated in FIG. 4. The second annular frame 22 is attached to the side of the adhesive tape 8 which is attached to the wafer 2. The wafer 2, which has been separated into the plurality of dies 20, is arranged within a central opening 24 of the second annular frame 22 (see FIG. 4).

Figure 5:
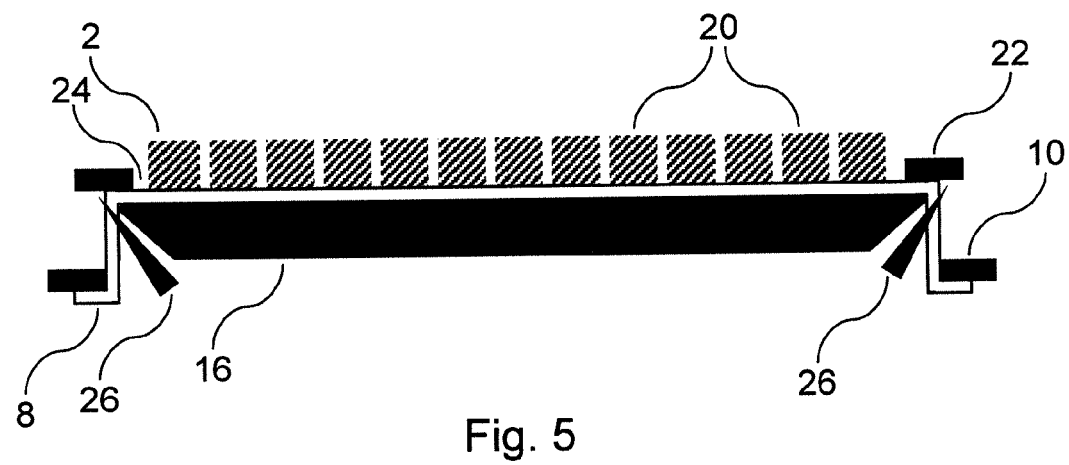
FIG. 5 is a cross-sectional view illustrating a step of circumferentially cutting the adhesive tape according to the first embodiment of the method of the present invention.

By attaching the second annular frame 22 to the peripheral portion of the expanded adhesive tape 8, radial tension of the tape 8 is maintained, thus reliably preventing any damage to the dies 20 due to an unintentional contact therebetween, in particular, after cutting the expanded tape 8 (see FIG. 5).

As is shown in FIG. 4, an inner diameter of the second annular frame 22 is smaller than the outer diameter of the support member 16 in the plane of the support surface 14 and smaller than the inner diameter of the first annular frame 10. Hence, the second annular frame 22 can be attached to the peripheral portion of the expanded adhesive tape 8 in a simple manner, by pressing the second annular frame 22 against the peripheral portion of the support surface 14 with the expanded tape 8 arranged therebetween. In this way, a stable and reliable connection between second annular frame 22 and expanded tape 8 can be efficiently achieved.

The second annular frame 22 is attached to the portion of the expanded adhesive tape 8 arranged at the peripheral part of the support member 16 by using a second frame holding means (not shown) and a second moving means (not shown). The second frame holding means holds the second annular frame 22. The second moving means moves the second frame holding means, holding the second annular frame 22, and the support member 16 relative to each other in the direction perpendicular to the plane of the support surface 14. By moving the second frame holding means and the support member 16 relative to each other in this way, the second annular frame 22 is attached to the portion of the expanded adhesive tape 8 arranged at the peripheral part of the support member 16.

The second frame holding means and the second moving means form part of the wafer processing system according to the first embodiment of the present invention. The control of the wafer processing system is configured to control movement of the second frame holding means and the support member 16 relative to each other in the direction perpendicular to the plane of the support surface 14, by controlling the second moving means.

The second annular frame 22 may be a semiconductor-sized annular frame. In this way, further processing of the wafer 2 after it has been divided, e.g., further processing after storage or shipping thereof, is facilitated, as has been detailed above.

After the second annular frame 22 has been attached to the expanded adhesive tape 8, the adhesive tape 8 is circumferentially cut in a position arranged outside the portion of the adhesive tape 8 which is attached to the second annular frame 22, as is illustrated in FIG. 5. The adhesive tape 8 is circumferentially cut by using a cutting means 26, such as a knife or a blade, which is circumferentially moved around the support member 16. As is further shown in FIG. 5, the cutting process is facilitated by the chamfered or tapered peripheral portion 18 of the support member 16 which gives the cutting means 26 particularly good access to the adhesive tape 8.

The cutting means 26 forms part of the wafer processing system according to the first embodiment of the present invention. The control of the wafer processing system is configured to control the cutting process performed by the cutting means 26.

Figure 6:
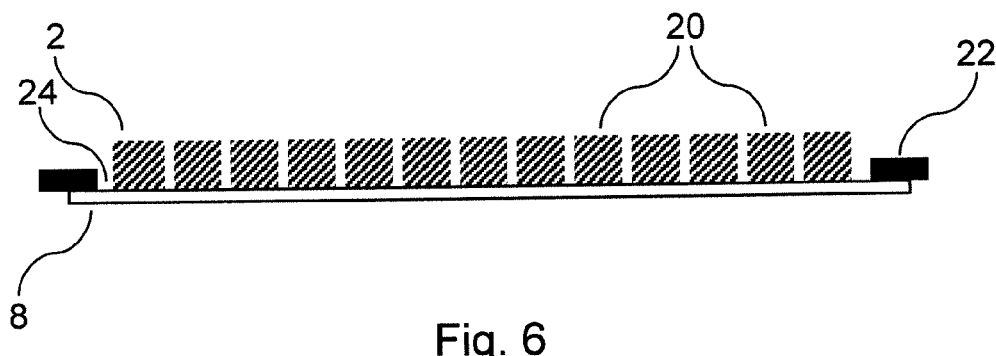
FIG. 6 is a cross-sectional view showing the wafer attached to the adhesive tape supported by the second annular frame after the step of circumferentially cutting the adhesive tape according to the first embodiment of the method of the present invention.

Subsequently, the second annular frame 22 and the divided wafer 2 attached thereto through the adhesive tape 8 are removed from the wafer processing system, as is illustrated in FIG. 6. In this state, the divided wafer 2, which is supported by the second annular frame 22, can be subjected to further processing, stored or shipped. Due to the use of the second annular frame 22, which is attached directly to the peripheral portion of the expanded adhesive tape 8, the tension applied to the expanded tape 8 can be reliably maintained over an extended period of time, e.g., during storage or shipping of the wafer 2.

In the following, a second embodiment of the method of processing a wafer of the present invention and of the wafer processing system of the present invention will be described with reference to FIGS. 7 to 11.

The second embodiment of the invention substantially differs from the first embodiment of the invention in the configuration of the support member 16, as will be detailed below. In the description of the second embodiment, those elements which are substantially identical to those of the first embodiment are denoted by the same reference signs and a repeated description thereof is omitted.

Figure 7:
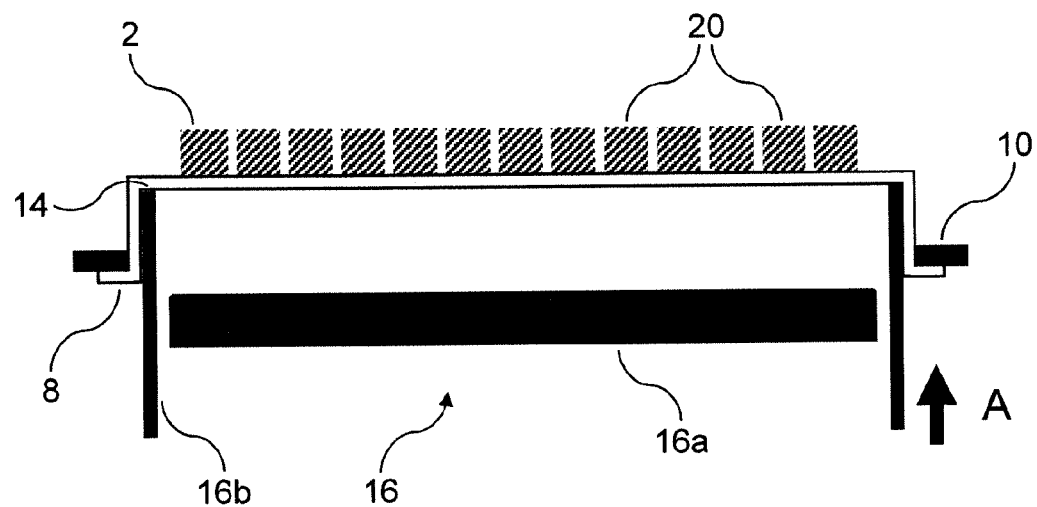
FIG. 7 is a cross-sectional view illustrating a step of radially expanding the adhesive tape according to a second embodiment of the method of the present invention.

As is shown in FIG. 7, the support member 16 according to the second embodiment comprises a central part 16*a* and an annular peripheral part 16*b* surrounding the central part 16*a*. The peripheral part 16*b* of the support member 16 is movable relative to the central part 16*a* of the support member 16 in the direction perpendicular to the plane of the support surface 14.

The central part 16*a* is in the form of a support table, e.g., having a circular cross-section in the plane of the support surface 14. For example, the central part 16*a* may be in the form of a chuck table. The central part 16*a* has a continuous support surface.

The peripheral part 16*b* has an annular cross-section in the plane of the support surface 14. For example, the peripheral part 16*b* may be in the form of a hollow expansion drum. The peripheral part 16*b* has a discontinuous support surface.

The steps of attaching the wafer 2 to the adhesive tape 8 supported by the first annular frame 10 and applying the laser beam LB to the wafer 2 along the division lines, so as to form a modified region in the wafer 2 along the division lines, are substantially the same as for the first embodiment described above.

After the laser beam LB has been applied to the wafer 2, forming the modified region in the wafer 2, the first annular frame 10 and the peripheral part 16*b* of the support member 16 are moved relative to each other in the direction perpendicular to the plane of the support surface 14, so as to radially expand the adhesive tape 8 in the directions lying in the plane of the support surface 14, thereby dividing the wafer 2 along the division lines into the plurality of dies 20, as is illustrated by an arrow A in FIG. 7. Only the peripheral part 16b of the support member 16 and the first annular frame 10 may be moved relative to each other. The central part 16a of the support member 16 may be kept stationary during the tape expansion process.

Figure 8:
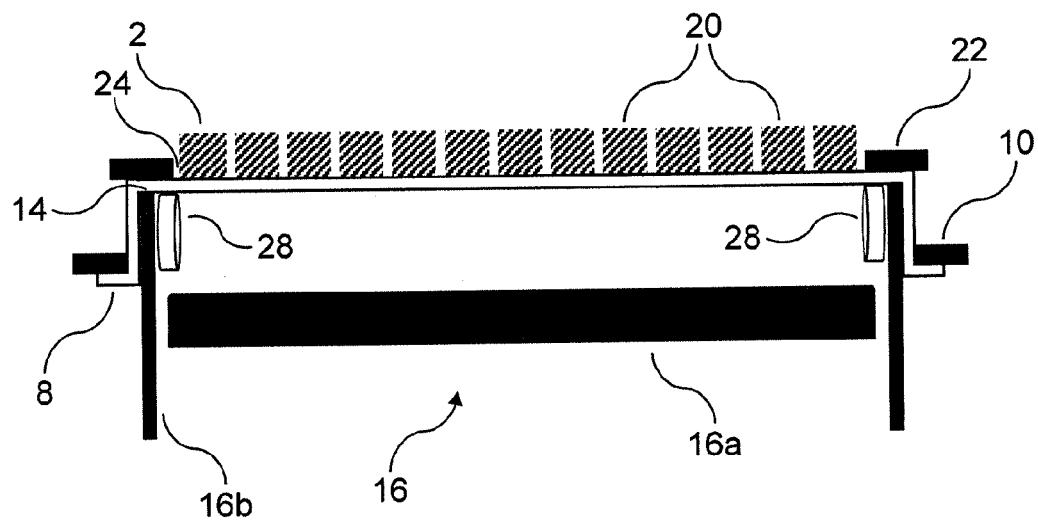
FIG. 8 is a cross-sectional view illustrating a step of attaching a second annular frame to a portion of the expanded adhesive tape and a first step of pressing the portion of the adhesive tape against the second annular frame according to the second embodiment of the method of the present invention.

Subsequently, the second annular frame 22 is attached to a portion of the expanded adhesive tape 8 arranged at the peripheral support member part 16b, as is illustrated in FIG. 8. The second annular frame 22 is attached to the side of the adhesive tape 8 which is attached to the wafer 2. The wafer 2, which has been separated into the plurality of dies 20, is arranged within the central opening 24 of the second annular frame 22 (see FIG. 8).

As is shown in FIG. 8, the inner diameter of the second annular frame 22 is smaller than the outer diameter of the support member 16 in the plane of the support surface 14, i.e., the outer diameter of the peripheral part 16b of the support member 16, and smaller than the inner diameter of the first annular frame 10. Hence, the second annular frame 22 can be attached to the peripheral portion of the expanded adhesive tape 8 in a simple manner, by pressing the second annular frame 22 against the support surface 14 of the peripheral support member part 16b with the expanded tape 8 arranged therebetween. In this way, a stable and reliable connection between second annular frame 22 and expanded tape 8 can be efficiently achieved.

Subsequently, as is also illustrated in FIG. 8, pressure is applied to a radially inner part of the portion of the expanded adhesive tape 8 attached to the second annular frame 22 by using a pressing means 28 comprising a pair of rollers. The rollers of the pressing means 28 are moved circumferentially along the inner part of the portion of the adhesive tape 8 which is attached to the second annular frame 22, pressing this inner part against the second annular frame 22. In this way, the fixation of the adhesive tape 8 to the second annular frame 22 is further improved.

The pressing means 28 forms part of the wafer processing system according to the second embodiment of the present invention. The control of the wafer processing system is configured to control the pressing process performed by the pressing means 28.

Figure 9:
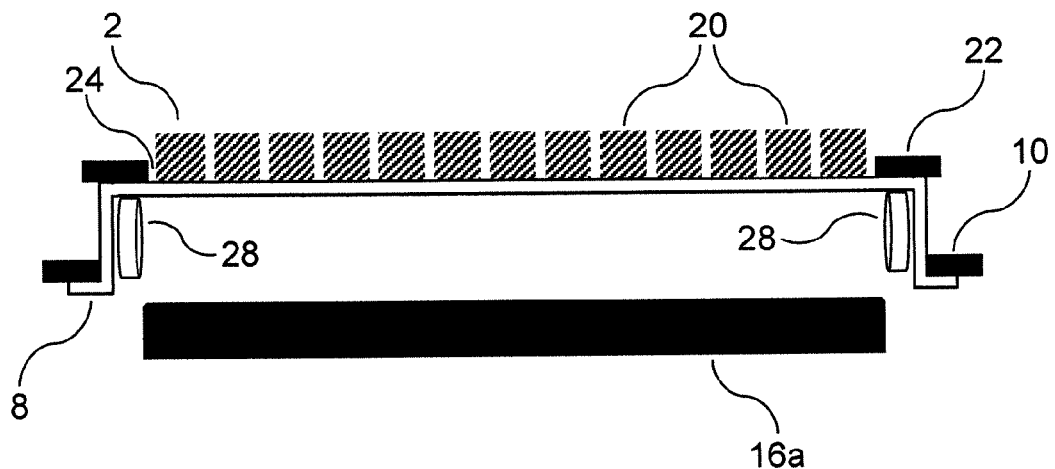
FIG. 9 is a cross-sectional view illustrating a second step of pressing the portion of the adhesive tape against the second annular frame according to the second embodiment of the method of the present invention.

After performing the pressing process on the inner part of the portion of the expanded adhesive tape 8 attached to the second annular frame 22, the peripheral part 16b of the support member 16 is retracted and a similar pressing process is carried out on a radially outer part of the portion of the expanded adhesive tape 8 attached to the second annular frame 22 (see FIG. 9). In this way, a particularly homogeneous connection between adhesive tape 8 and second annular frame 22 is achieved. For this additional pressing process, the same pressing means 28 as in the pressing process illustrated in FIG. 8 is used, as is shown in FIG. 9.

Figure 10:
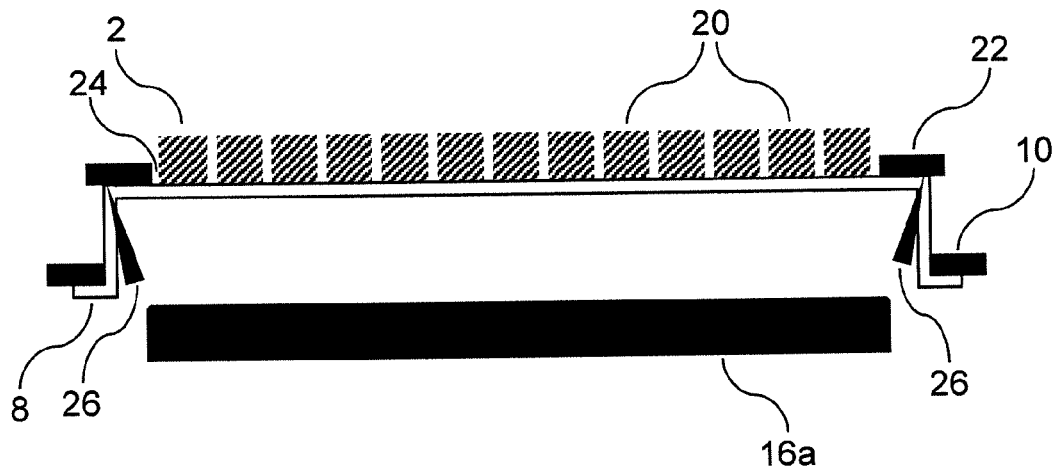
FIG. 10 is a cross-sectional view illustrating a step of circumferentially cutting the adhesive tape according to the second embodiment of the method of the present invention.

Subsequently, as is illustrated in FIG. 10, the adhesive tape 8 is circumferentially cut in a position arranged outside the portion of the adhesive tape 8 which is attached to the second annular frame 22. This cutting process is carried out substantially in the same manner as in the first embodiment (see FIG. 5), using the same cutting means 26.

Figure 11:
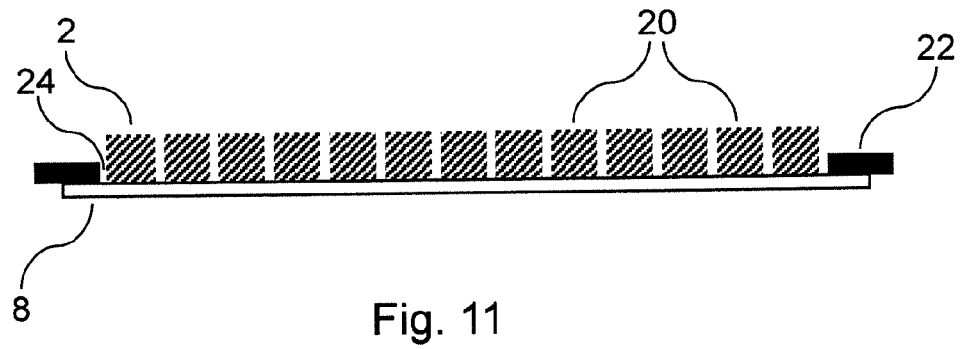
FIG. 11 is a cross-sectional view showing the wafer attached to the adhesive tape supported by the second annular frame after the step of circumferentially cutting the adhesive tape according to the second embodiment of the method of the present invention.

After cutting the adhesive tape 8 in this way, the second annular frame 22 and the divided wafer 2 attached thereto through the adhesive tape 8 are removed from the wafer processing system, as is illustrated in FIG. 11. In this state, the divided wafer 2, which is supported by the second annular frame 22, can be subjected to further processing, stored or shipped. Due to the use of the second annular frame 22, which is attached directly to the peripheral portion of the expanded adhesive tape 8, the tension applied to the expanded tape 8 can be reliably maintained over an extended period of time, e.g., during storage or shipping of the wafer 2.

The invention claimed is:

1. A method of processing a wafer, having on one side a device area with a plurality of devices partitioned by a plurality of division lines, wherein the method comprises:
   attaching the one side of the wafer or a side of the wafer opposite to the one side to an adhesive tape supported by a first annular frame, so that the wafer is arranged within a central opening of the first annular frame;
   applying a laser beam to the wafer along the division lines, so as to form a modified region in the wafer along the division lines;
   placing the wafer attached to the adhesive tape on a support surface of a support member before or after applying the laser beam to the wafer, so that the side of the adhesive tape opposite to the side thereof which is attached to the wafer is in contact with the support surface, wherein an outer diameter of the support member in the plane of the support surface is smaller than an inner diameter of the first annular frame;
   after applying the laser beam to the wafer, moving the first annular frame and at least a peripheral part of the support member relative to each other in the direction perpendicular to the plane of the support surface, so as to radially expand the adhesive tape in the directions lying in the plane of the support surface, thereby dividing the wafer along the division lines into a plurality of dies; and
   attaching a second annular frame to a portion of the expanded adhesive tape arranged at the peripheral part of the support member, wherein the second annular frame is attached to the side of the adhesive tape which is attached to the wafer and the wafer, which has been separated into the plurality of dies, is arranged within a central opening of the second annular frame; wherein
      an inner diameter of the second annular frame is smaller than the outer diameter of the support member in the plane of the support surface and smaller than the inner diameter of the first annular frame.

2. The method according to claim 1, wherein
   the wafer attached to the adhesive tape is placed on the support surface of the support member before applying the laser beam to the wafer, and
   the laser beam is applied to the wafer placed on the support surface along the division lines, so as to form the modified region in the wafer along the division lines.

3. The method according to claim 1, wherein the wafer attached to the adhesive tape is placed on the support surface of the support member after applying the laser beam to the wafer.

4. The method according to claim 1, wherein the first annular frame and the entire support member are moved relative to each other in the direction perpendicular to the plane of the support surface, so as to radially expand the adhesive tape in the directions lying in the plane of the support surface, thereby dividing the wafer along the division lines into the plurality of dies.

5. The method according to claim 1, wherein
   the support member comprises a central part and an annular peripheral part surrounding the central part,
   the peripheral part of the support member is movable relative to the central part of the support member in the direction perpendicular to the plane of the support surface, and the first annular frame and the peripheral part of the support member are moved relative to each other in the direction perpendicular to the plane of the support surface, so as to radially expand the adhesive tape in the directions lying in the plane of the support surface, thereby dividing the wafer along the division lines into the plurality of dies.

6. The method according to claim 1, further comprising, after attaching the second annular frame to the expanded adhesive tape, circumferentially cutting the adhesive tape in a position arranged outside the portion of the adhesive tape (8) which is attached to the second annular frame.

7. The method according to claim 6, further comprising, after cutting the adhesive tape, attaching to the second annular frame a portion of the adhesive tape which is arranged between the position where the adhesive tape had been cut and the portion of the adhesive tape which is attached to the second annular frame.

8. The method according to claim 1, wherein the inner diameter of the second annular frame is smaller than the outer diameter of the support member in the plane of the support surface and/or smaller than the inner diameter of the first annular frame by 20 mm or more.

9. The method according to claim 1, wherein an outer diameter of the first annular frame is substantially the same as an outer diameter of the second annular frame.

10. The method according to claim 1, wherein the second annular frame is a semiconductor-sized annular frame.

11. A wafer processing system for processing a wafer, having on one side a device area with a plurality of devices partitioned by a plurality of division lines, wherein the system comprises:
    a support member having a support surface for placing the wafer thereon;
    a first frame holding means for holding a first annular frame;
    a laser beam applying means for applying a laser beam to the wafer along the division lines; and
    a second frame holding means for holding a semiconductor-sized second annular frame; wherein
    the support member and the first frame holding means are configured so that the first frame holding means and at least a peripheral part of the support member are movable relative to each other in the direction perpendicular to the plane of the support surface,
    the support member and the second frame holding means are configured so that the second frame holding means and at least the peripheral part of the support member are movable relative to each other in the direction perpendicular to the plane of the support surface, and
    an outer diameter of the support member in the plane of the support surface is larger than an inner diameter of the semiconductor-sized second annular frame.

12. The wafer processing system according to claim 11, further comprising the first annular frame, wherein the outer diameter of the support member in the plane of the support surface is smaller than an inner diameter of the first annular frame.

* * * * *